United States Patent
Lianfeng et al.

(10) Patent No.: US 10,998,396 B2
(45) Date of Patent: May 4, 2021

(54) SEMICONDUCTOR STRUCTURE AND METHOD FOR FORMING A SEMICONDUCTOR STRUCTURE

(71) Applicants: Semiconductor Manufacturing International (Beijing) Corporation, Beijing (CN); Semiconductor Manufacturing International (Shanghai) Corporation, Shanghai (CN)

(72) Inventors: Hu Lianfeng, Shanghai (CN); Hu Youcun, Shanghai (CN); Yang Ming, Shanghai (CN); Bei Duohui, Shanghai (CN); Ni Baibing, Shanghai (CN)

(73) Assignees: Semiconductor Manufacturing (Beijing) international Corporation, Beijing (CN); Semiconductor Manufacturing (Shanghai) International Corporation, Shanghai (CN)

( * ) Notice: Subject to any disclaimer, the term of this patent is extended or adjusted under 35 U.S.C. 154(b) by 0 days.

(21) Appl. No.: 16/537,167

(22) Filed: Aug. 9, 2019

(65) Prior Publication Data
US 2020/0168699 A1    May 28, 2020

(30) Foreign Application Priority Data
Nov. 22, 2018   (CN) .......................... 201811395542.8

(51) Int. Cl.
*H01L 49/02* (2006.01)
*H01L 21/02* (2006.01)
(Continued)

(52) U.S. Cl.
CPC .......... *H01L 28/60* (2013.01); *H01L 21/0228* (2013.01); *H01L 21/02068* (2013.01);
(Continued)

(58) Field of Classification Search
CPC ... H01L 33/486; H01L 33/502; H01L 33/505; H01L 33/507; H01L 33/54; H01L 33/56;
(Continued)

(56) References Cited

U.S. PATENT DOCUMENTS 6,791,187 B2 * 9/2004 Ema ................... H01L 21/76897
257/750
10,679,936 B2 * 6/2020 Wei .................... H01L 21/76816
(Continued)

*Primary Examiner* — Zandra V Smith
*Assistant Examiner* — Andre C Stevenson
(74) *Attorney, Agent, or Firm* — Brinks Gilson & Lione

(57) ABSTRACT

A semiconductor structure and a forming method thereof are disclosed. The forming method includes: providing a base; forming a first electrode layer on the base; forming a capacitance dielectric layer on a top and a sidewall of the first electrode layer; and forming a second electrode layer conformally covering the capacitance dielectric layer. Compared with a solution in which the capacitance dielectric layer only covers the top of the first electrode layer, in the present disclosure, an effective area between the second electrode layer and the first electrode layer is increased, the second electrode layer, the first electrode layer, and the capacitance dielectric layer located on the top of the first electrode layer construct one capacitance, and the second electrode layer, the first electrode layer, and the capacitance dielectric layer located on the sidewall of the first electrode layer construct other four capacitances. That is, the formed capacitor structure includes five parallel capacitances. In a situation in which other conditions are the same, for example, the areas of bases are equal, the capacitance density of the capacitor structure is increased.

18 Claims, 5 Drawing Sheets

(51) Int. Cl.
   *H01L 21/311* (2006.01)
   *H01L 21/285* (2006.01)
(52) U.S. Cl.
   CPC .... *H01L 21/02274* (2013.01); *H01L 21/2855* (2013.01); *H01L 21/31116* (2013.01); *H01L 21/31144* (2013.01)
(58) Field of Classification Search
   CPC ....... H01L 2933/0041; H01L 2933/005; G02F 1/1335; B32B 2457/206
   See application file for complete search history.

(56) References Cited

U.S. PATENT DOCUMENTS

2001/0046737 A1* 11/2001 Ahn ................. H01L 27/10888
                                                              438/253
2011/0175152 A1*  7/2011 Booth, Jr. ............... H01L 28/40
                                                              257/306
2014/0002976 A1*  1/2014 Brain ................ H01L 27/10894
                                                              361/679.02
2018/0337000 A1* 11/2018 Jen ........................... H01G 4/06

\* cited by examiner

US 10,998,396 B2

SEMICONDUCTOR STRUCTURE AND METHOD FOR FORMING A SEMICONDUCTOR STRUCTURE

RELATED APPLICATIONS

The present application claims priority to Chinese Patent Appln. No. 201811395542.8, filed Nov. 22, 2018, the entire disclosure of which is hereby incorporated by reference.

BACKGROUND

Technical Field

Embodiments and implementations of the present disclosure relate to the field of semiconductor manufacturing, and in particular, to a semiconductor structure and a forming method thereof.

Related Art

A capacitor element is usually used as an electronic passive device in an integrated circuit (for example, a radio frequency circuit or a mixed signal circuit). A common capacitor element includes a metal oxide semiconductor (MOS) capacitor, a PN junction capacitor, a polysilicon-insulator-polysilicon (PIP) capacitor, a metal-insulator-metal (MIM) capacitor, and the like.

The MIM capacitor is generally formed on a metal interconnection structure in a back-end of line (BEOL), so that a distance between the MIM capacitor and a Si substrate is increased, thereby reducing stray capacitances between the MIM capacitor and the substrate, and the performance of the MIM capacitor is less affected by the frequency and temperature. In addition, the MIM capacitor is formed in a metal interconnection procedure, and an MIM capacitor forming process is compatible with an existing integrated circuit process. Therefore, the MIM capacitor has gradually become a mainstream capacitor type of a passive device.

SUMMARY

A problem to be addressed in embodiments and implementations of the present disclosure is to provide a semiconductor structure and a method for forming a semiconductor structure, to improve a capacitance density of an MIM capacitor.

To address the foregoing problem, one form of the present disclosure provides a method for forming a semiconductor structure, including: providing a base; forming a first electrode layer on the base; forming a capacitance dielectric layer on a top and a sidewall of the first electrode layer; and forming a second electrode layer conformally covering the capacitance dielectric layer.

In some implementations, the step of forming the capacitance dielectric layer includes: forming a capacitance dielectric film, where the capacitance dielectric film conformally covers the top and the sidewall of the first electrode layer, and the base exposed by the first electrode layer; forming a graphic layer on the capacitance dielectric film, where the graphic layer covers the capacitance dielectric film located on the top and the sidewall of the first electrode layer; removing, by using the graphic layer as a mask, the capacitance dielectric film exposed by the graphic layer, and reserving the capacitance dielectric film on the top and the sidewall of the first electrode layer as the capacitance dielectric layer; and removing the graphic layer.

In some implementations, the capacitance dielectric film is formed by using an atomic layer deposition process or a plasma chemical vapor deposition process.

In some implementations, the capacitance dielectric film exposed by the graphic layer is removed by using an anisotropic dry etching process.

In some implementations, the method further includes: after forming the capacitance dielectric layer, and before forming the second electrode layer, performing cleaning processing on the capacitance dielectric layer.

In some implementations, a solution used in the cleaning processing is an ST250 solution, an NE111 solution, an NE320 solution, or an EKC520 solution, and a process time of the cleaning processing is 10 s to 300 s.

In some implementations, in the step of forming the first electrode layer, the thickness of the first electrode layer is 300 Å to 800 Å.

In some implementations, in the step of forming the capacitance dielectric layer, the thickness of the capacitance dielectric layer is 20 Å to 130 Å.

In some implementations, the capacitance dielectric layer is a high-k dielectric layer formed by means of stacking.

In some implementations, the second electrode layer is formed by using a physical vapor deposition process.

In some implementations, a front-layer metal interconnection structure is formed in the base, and a top of the front-layer metal interconnection structure is aligned with a top of the base; the method further includes: before forming the first electrode layer, forming an etching stopping layer on the base and forming a first interlayer dielectric layer on the etching stopping layer; and the step of forming the first electrode layer includes: forming the first electrode layer on the first interlayer dielectric layer.

In some implementations, after forming the second electrode layer, the method further includes: forming an opening running through the second electrode layer and the capacitance dielectric layer, where the opening exposes the top of the first electrode layer; forming a second interlayer dielectric layer on the second electrode layer, where the second interlayer dielectric layer is further filled in the opening; forming a first through hole exposing a top of the second electrode layer in the second interlayer dielectric layer, and forming a second through hole exposing the top of the first electrode layer in the second interlayer dielectric layer at the position of the opening, where the second interlayer dielectric layer exposed by a sidewall of the second through hole covers the capacitance dielectric layer and the second electrode layer; and forming a first conductive pole in the first through hole, and forming a second conductive pole in the second through hole.

In some implementations, the second electrode layer conformally covers the capacitance dielectric layer and the base is formed.

Another form of the present disclosure further provides a semiconductor structure, including: a base; a first electrode layer, located on the base; a capacitance dielectric layer, located on a top and a sidewall of the first electrode layer; and a second electrode layer, conformally covering the capacitance dielectric layer.

In some implementations, the thickness of the first electrode layer is 300 Å to 800 Å.

In some implementations, the thickness of the capacitance dielectric layer is 20 Å to 130 Å.

In some implementations, the capacitance dielectric layer is a high-k dielectric layer of a lamination structure.

In some implementations, a front-layer metal interconnection structure is formed in the base, and a top of the front-layer metal interconnection structure is aligned with a top of the base; the semiconductor structure further includes: an etching stopping layer located on the base, and a first interlayer dielectric layer located on the etching stopping layer; and the first electrode layer is located on the first interlayer dielectric layer.

In some implementations, the semiconductor structure further includes: an opening running through the second electrode layer and the capacitance dielectric layer, where the opening exposes the top of the first electrode layer; a second interlayer dielectric layer located on the second electrode layer, where the second interlayer dielectric layer is further filled in the opening; a first conductive pole running through the second interlayer dielectric layer, where the first conductive pole is electrically connected a top of the second electrode layer; and a second conductive pole running through the second interlayer dielectric layer at the position of the opening, where the second conductive pole is electrically connected to the top of the first electrode layer, and the second conductive pole is isolated from the capacitance dielectric layer and the second electrode layer by using the second interlayer dielectric layer.

In some implementations, the second electrode layer conformally covers the capacitance dielectric layer and the base.

When compared with the prior art, the technical solutions of the embodiments and implementations of the present disclosure have the following advantages:

In the embodiments and implementations of the present disclosure, the formed capacitance dielectric layer covers the top and the sidewall of the first electrode layer, and the second electrode layer correspondingly conformally covers the capacitance dielectric layer. Compared with a solution in which the capacitance dielectric layer only covers the top of the first electrode layer, in the embodiments and implementations of the present disclosure, an effective area between the second electrode layer and the first electrode layer is increased, the second electrode layer, the first electrode layer, and the capacitance dielectric layer located on the top of the first electrode layer construct one capacitance, and the second electrode layer, the first electrode layer, and the capacitance dielectric layer located on the sidewall of the first electrode layer construct other four capacitances. That is, the formed capacitor structure includes five parallel capacitances. In a situation in which other conditions are the same, for example, the areas of bases are equal, the capacitance density of the capacitor structure is increased.

In some implementations, the method further includes: after forming the capacitance dielectric layer, and before forming the second electrode layer, performing cleaning processing on the capacitance dielectric layer. The cleaning processing is used to help remove polymers, dust particles, and movable metal ions on the surface of the capacitance dielectric layer. This not only improves the surface quality of the capacitance dielectric layer, and improves the water resistance of the surface of the capacitance dielectric layer, to provide a good interface state for subsequently forming the second electrode layer, but also can remove the movable metal ions, to reduce the probability of forming a conductive channel in the capacitance dielectric layer, and improve the reliability of the capacitance dielectric layer, thereby reducing the probability of forming a cavity in the capacitance dielectric layer, the second electrode layer, and the first electrode layer. Correspondingly, a leakage current problem can be improved, to further help improve the performance of a semiconductor device including the capacitor structure.

DETAILED DESCRIPTION

Although an MIM capacitor has gradually become a mainstream capacitor type of a passive device, currently, the capacitance density of the MIM capacitor is relatively low, and it is difficult to meet application requirements.

An MIM capacitor structure mainly includes a first electrode layer, a capacitance dielectric layer located on a top of the first electrode layer, and a second electrode layer located on the capacitance dielectric layer. One of the methods for improving the capacitance density is to reduce the thickness of the capacitance dielectric layer. However, reducing the thickness of the capacitance dielectric layer correspondingly reduces a linearity between a capacitance value and the thickness of the capacitance dielectric layer, and further easily causes excessively high electric field intensity to trigger a leakage current problem. Another method is to increase areas of the first electrode layer and the second electrode layer, but because they are planar structures, increasing the areas occupies a relatively large area of a base. This does not help to improve the integration.

Therefore, how to form an MIM capacitor that has relatively large capacitance density and occupies a relatively small area of a base is a technical problem to be resolved currently.

To address the technical problem, in embodiments and implementations of the present disclosure, the formed capacitance dielectric layer covers a top and a sidewall of the first electrode layer, and the second electrode layer correspondingly conformally covers the capacitance dielectric layer. Compared with a solution in which the capacitance dielectric layer only covers the top of the first electrode layer, in the embodiments and implementations of the present disclosure, an effective area between the second electrode layer and the first electrode layer is increased, the second electrode layer, the first electrode layer, and the capacitance dielectric layer located on the top of the first electrode layer construct one capacitance, and the second electrode layer, the first electrode layer, and the capacitance dielectric layer located on the sidewall of the first electrode layer construct other four capacitances. That is, the formed capacitor structure includes five parallel capacitances. In a situation in which other conditions are the same, for example, the areas of bases are equal, the capacitance density of the capacitor structure is increased.

To make the foregoing objectives, features, and advantages of the embodiments of the present disclosure clearer and more comprehensible, the following describes specific embodiments and implementations of the present disclosure in detail with reference to the accompanying drawings.

FIG. 1 to FIG. 10 are schematic structural diagrams corresponding to steps in one form of a method for forming a semiconductor structure.

Figure 1:
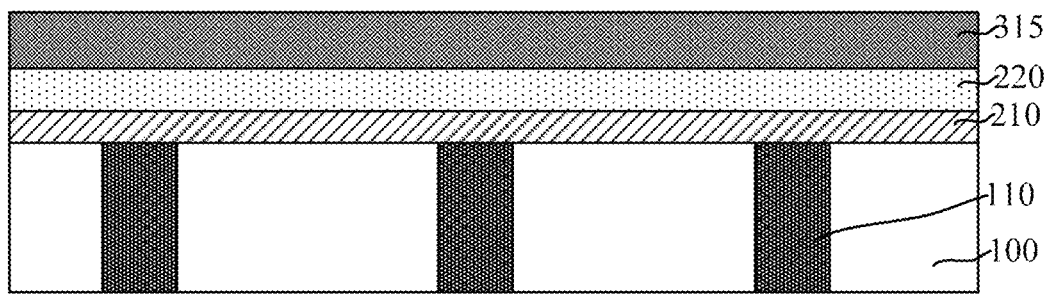
FIG. 1 to FIG. 10 are schematic structural diagrams corresponding to steps in one form of a method for forming a semiconductor structure.

Referring to FIG. 1, a base 100 is provided. The base 100 is used to provide a process platform for subsequently forming an MIM capacitor. In some implementations, to facilitate representation, only a base 100 of a capacitance region (not marked) is shown, and an MIM capacitor is correspondingly formed on the base 100 of the capacitance region.

In some implementations, the base 100 includes a substrate, and the substrate is a Si substrate. In other implementations, the material of the substrate may be another material such as Ge, SiGe, SiC, GaAs, or InGa. The substrate may also be a substrate of another type, such as a Si substrate on an insulator or a Ge substrate on an insulator.

Other structures such as a MOS transistor, a resistor, an inductor, a dielectric layer, and the metal interconnection structure may also be formed in the base 100. In some implementations, a front-layer metal interconnection structure 110 is formed in the base 100, and a top of the front-layer metal interconnection structure 110 is aligned with a top of the base 100.

Based on process situations, along a normal direction on the surface of the base 100, one or more stacked metal layers, for example, a first metal (that is, M1) layer and a second metal (that is, M2) layer, are formed in the base 100. When the metal layer is multilayer, an inter metal dielectric (IMD) layer is formed between two neighboring metal layers, and the two neighboring metal layers are electrically connected by using a via interconnection structure located therebetween.

In some implementations, that the front-layer metal interconnection structure 110 is a first metal layer is used as an example for description. The front-layer metal interconnection structure 110 is correspondingly a single damascene structure. In other implementations, in a situation in which multiple metal layers are formed in the base, the front-layer metal interconnection structure is correspondingly a dual damascene structure, and includes a via interconnection (Viax-1) structure, and a metal (Mx) layer located above the via interconnection structure and connected to the via interconnection structure.

Therefore, still referring to FIG. 1, the forming method further includes: forming an etching stopping layer 210 on the base 100.

In a process of subsequently forming the metal interconnection structure, the surface of the etching stopping layer 210 is used to define an etching stopping position in an etching process, thereby reducing the probability of causing over etching to the front-layer metal interconnection structure 110.

In some implementations, the material of the etching stopping layer 210 is SiCN. In other implementations, the material of the etching stopping layer may also be SiCO, SiON, or SiN.

Figure 2:
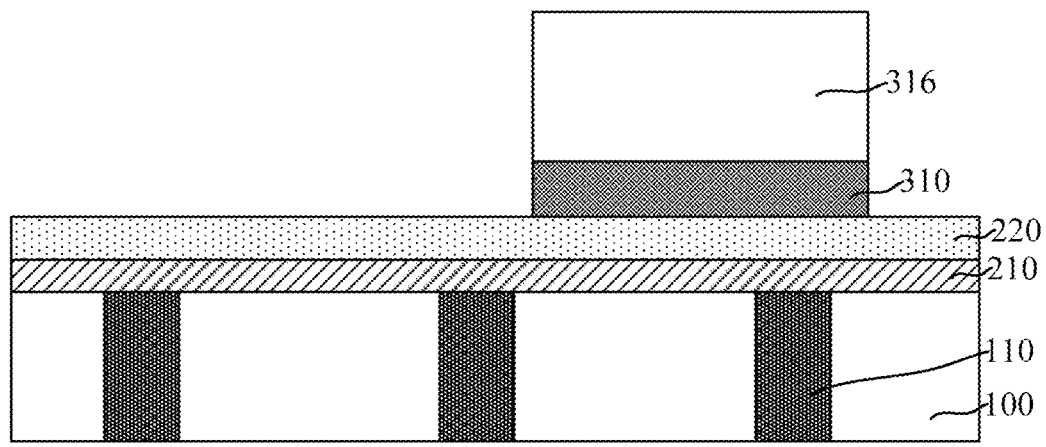

Referring to FIG. 1 and FIG. 2, a first electrode layer 310 (as shown in FIG. 2) is formed on the base 100. The first electrode layer 310 is used as a bottom plate of the MIM capacitor. Therefore, the material of the first electrode layer 310 is a metal material. Specifically, the material of the first electrode layer 310 is an inert nitride metal, so that the first electrode layer 310 has relatively high stability, to improve a problem of metal ion diffusion. In some implementations, the material of the first electrode layer 310 is TiN, while in other implementations, the material of the first electrode layer may also be TaN or WN.

It should be noted that, subsequently, the capacitance dielectric layer is not only formed on the top of the first electrode layer 310, but also formed on the sidewall of the first electrode layer 310, and the first electrode layer 310, the capacitance dielectric layer located on any sidewall of the first electrode layer 310, and the second electrode layer subsequently covering the capacitance dielectric layer construct a sidewall capacitance. Therefore, a sidewall area of the first electrode layer 310 may affect a capacitance value of the sidewall capacitance, thereby affecting the capacitance density of the MIM capacitor.

In some implementations, to prevent the first electrode layer 310 from overly occupying the area of the base 100, the thickness of the first electrode layer 310 is reasonably controlled, thereby adjusting the sidewall area of the first electrode layer 310.

As can be known from a capacitance formula, the capacitance value is proportional to the area of an electrode plate. A smaller thickness of the first electrode layer 310 indicates a smaller sidewall area of the first electrode layer 310, thereby causing a relatively small increase degree of the capacitance density of the MIM capacitor, and the performance of the MIM capacitor still cannot meet application requirements. However, the thickness of the first electrode layer 310 should also not be excessively large. Otherwise, a total capacitance value may be excessively large, thereby triggering a problem that the performance of the semiconductor device is poor. Therefore, in some implementations, the thickness of the first electrode layer 310 is 300 Å to 800 Å.

It should be noted that, the MIM capacitor is formed between neighboring metal layers in a BEOL. Therefore, the first electrode layer 310 is formed on a partial region on the base 100.

Specifically, the step of forming the first electrode layer 310 includes: forming a first electrode material layer 315 (as shown in FIG. 1) on the base 100, forming a first photoresist layer 316 (as shown in FIG. 2) on the first electrode material layer 315, etching the first electrode material layer 315 using the first photoresist layer 316 as a mask, and reserving the residual first electrode material layer 315 as the first electrode layer 310.

In some implementations, the first electrode material layer 315 is formed using a physical vapor deposition process. In other implementations, the first electrode material layer may also be formed using an atomic layer deposition process.

In some implementations, to improve the shape quality of the first electrode layer 310, the first electrode material layer 315 is etched using an anisotropic dry etching process, for example, a plasma dry etching process.

After the first electrode layer 310 is formed, the first photoresist layer 316 is removed by ashing or wet removing of photoresist.

In some implementations, the etching stopping layer 210 is formed on the base 100, and the first electrode layer 310 is correspondingly formed on the etching stopping layer 210.

Still referring to FIG. 1, it should be noted that, before forming the first electrode material layer 315, the method further includes: forming a first interlayer dielectric layer 220 on the etching stopping layer 210.

The first interlayer dielectric layer 220 is used as a transition layer between the first electrode material layer 315 and the etching stopping layer 210, to reduce the probability that the first electrode layer 310 has a delamination or crack problem caused by a stress.

The first interlayer dielectric layer 220 is further used to implement isolation between the front-layer metal interconnection structure 110 and the subsequently formed metal interconnection structure.

Therefore, in some implementations, the material of the first interlayer dielectric layer 220 is SiO. In other implementations, the material of the first interlayer dielectric layer may also be a low-k dielectric material (the low-k dielectric material refers to a dielectric material with a relative dielectric constant greater than or equal to 2.6, and less than or equal to 3.9) or an ultra-low-k dielectric material (the ultra-low-k dielectric material refers to a dielectric material with a relative dielectric constant less than 2.6), for example, SiOH, SiOCH, FSG, BSG, PSG, BPSG, HSQ, or MSQ.

Correspondingly, in some implementations, the step of forming the first electrode layer 310 includes: forming the first electrode layer 310 on the first interlayer dielectric layer 220.

Figure 3:
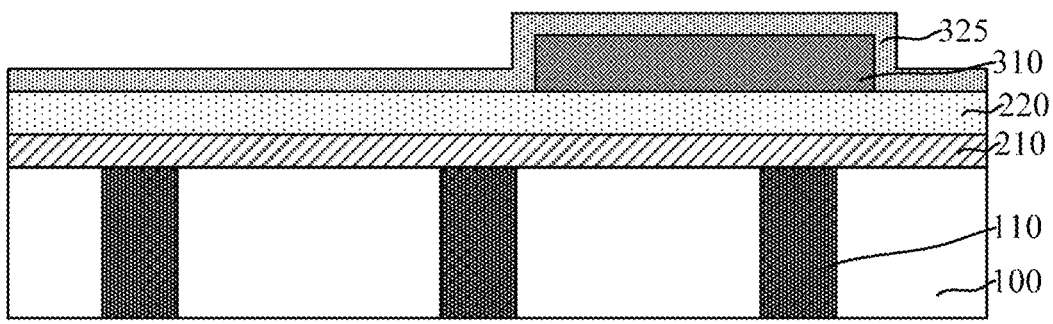
Figure 4:
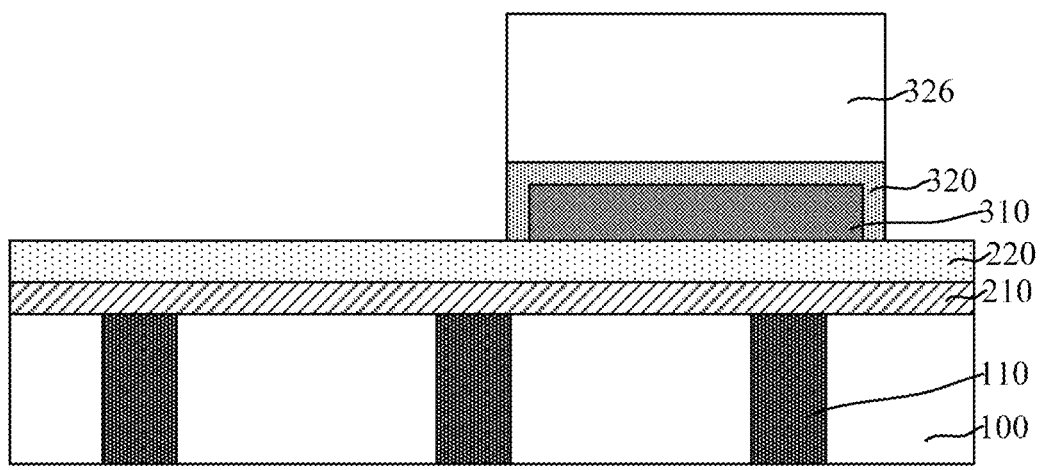

Referring to FIG. 3 and FIG. 4, a capacitance dielectric layer 320 (as shown in FIG. 4) is formed on the top and the sidewall of the first electrode layer 310. The capacitance dielectric layer 320 is used as an insulating layer in the MIM capacitor.

In some implementations, the material of the capacitance dielectric layer 320 is a high-k dielectric material. The high-k dielectric material refers to a dielectric material with a relative dielectric constant greater than a relative dielectric constant of SiO. The high-k dielectric material is used to help improve a capacitance value of the MIM capacitor.

Specifically, the capacitance dielectric layer 320 is a high-k dielectric layer formed by means of stacking, that is, the capacitance dielectric layer 320 is a high-k composite dielectric layer. After the forming thickness of the high-k dielectric layer reaches a value, the forming quality easily become poor. Therefore, the high-k composite dielectric layer is used to make the thickness of the capacitance dielectric layer 320 meet process requirements, and have relatively good forming quality.

In some implementations, the high-k dielectric material may be any types of $HfO_2$, HfSiO, $TiO_2$, HfZrO, HfSiON, HfTaO, HfTiO, $Ta_2O_5$, $ZrO_2$, $ZrSiO_2$, $Al_2O_3$, $SrTiO_3$, and BaSrTiO. In other implementations, based on process requirements, the material of the capacitance dielectric layer may also be one or more of SiO, SiON, and SiN.

The capacitance dielectric layer in the MIM capacitor is generally only located on the top of the first electrode layer. In some implementations, the capacitance dielectric layer 320 is not only formed on the top of the first electrode layer 310, but also formed on the sidewall of the first electrode layer 310, and a subsequent procedure further includes forming a second electrode layer conformally covering the capacitance dielectric layer 320. Compared with a solution in which the capacitance dielectric layer only covers the top of the first electrode layer, in some implementations, an effective area between a top plate and a bottom plate of the MIM capacitor is increased, so that the second electrode layer, the first electrode layer 310, and the capacitance dielectric layer 320 located on the top of the first electrode layer 310 construct one capacitance, and the second electrode layer, the first electrode layer 310, and the capacitance dielectric layer 320 located on the sidewall of the first electrode layer 310 construct other four capacitances (that is, four sidewall capacitances). The formed capacitor structure includes five parallel capacitances, and a total capacitance value of the parallel capacitances is equal to the sum of capacitance values. Therefore, in a situation in which other conditions are the same, for example, the areas of the bases 100 are equal, the capacitance density of the capacitor structure is increased, so that the performance of the MIM capacitor can meet application requirements.

As can be known from the capacitance formula, a capacitance value of a single capacitor is inversely proportional to the thickness of the capacitance dielectric layer 320. A larger thickness of the capacitance dielectric layer 320 indicates a smaller capacitance value of the single capacitor, thereby causing a relatively small total capacitance value of the parallel capacitances. Therefore, the thickness of the capacitance dielectric layer 320 cannot be excessively large. However, the thickness of the capacitance dielectric layer 320 should also not be excessively small. If the thickness of the capacitance dielectric layer 320 is excessively small, the thickness uniformity and the film layer quality of the capacitance dielectric layer 320, and the coverage capability of the capacitance dielectric layer 320 on the first electrode layer 310 are easily reduced. In addition, if the thickness of the capacitance dielectric layer 320 is excessively small, the linearity between the capacitance value and the thickness of the capacitance dielectric layer 320 may be reduced, and a leakage current problem is easily triggered. Therefore, in this embodiment, the thickness of the capacitance dielectric layer 320 is 20 Å to 130 Å.

It should be noted that, in an actual process, the thickness of the capacitance dielectric layer 320 and the thickness of the first electrode layer 310 should be controlled within a reasonable range, and reasonably matched, thereby improving the capacitance density, so that the total capacitance value of the MIM capacitors meets application requirements, and reducing the probability of generating side effects.

Specifically, the step of forming the capacitance dielectric layer 320 includes: forming a capacitance dielectric film 325 (as shown in FIG. 3), where the capacitance dielectric film 325 conformally covers the top and the sidewall of the first electrode layer 310, and the first interlayer dielectric layer 220 exposed by the first electrode layer 310; forming a graphic layer 326 (as shown in FIG. 4) on the capacitance dielectric film 325, where the graphic layer 326 covers the capacitance dielectric film 325 located on the top and the sidewall of the first electrode layer 310; and removing, by using the graphic layer 326 as a mask, the capacitance dielectric film 325 exposed by the graphic layer 326, and reserving the capacitance dielectric film 325 on the top and the sidewall of the first electrode layer 310 as the capacitance dielectric layer 320.

In some implementations, the capacitance dielectric film 325 is formed using an atomic layer deposition process. The atomic layer deposition process includes performing an atomic layer deposition cycle for multiple times to form the capacitance dielectric film 325 with the required thickness. The atomic layer deposition process is used to help improve the thickness uniformity of the capacitance dielectric layer 320 so that the thickness of the capacitance dielectric layer 320 can be precisely controlled. In addition, the gap filling performance and the step coverage of the atomic layer deposition process are good, and the conformal coverage capability of the capacitance dielectric film 325 is correspondingly improved, thereby improving the coverage capability of the capacitance dielectric layer 320 on the top and the sidewall of the first electrode layer 310.

In other implementations, the capacitance dielectric film may also be formed using another deposition process, for example, a plasma chemical vapor deposition process.

In some implementations, to improve the shape quality of the capacitance dielectric layer 320, an anisotropic dry etching process is used to remove the capacitance dielectric film 325 exposed by the graphic layer 326, to avoid lateral losses affected by the capacitance dielectric layer 320; and the anisotropic dry etching process is used to further help improve the thickness accuracy of the capacitance dielectric layer 320, and the coverage capability of the capacitance dielectric layer 320 on the top and the sidewall of the first electrode layer 310. Specifically, the anisotropic dry etching process is a plasma dry etching process.

In some implementations, the graphic layer 326 is a second photoresist layer, and after the capacitance dielectric layer 320 is formed, the graphic layer 326 is removed by ashing manner or wet removing of photoresist.

It should be noted that, after removing the graphic layer 326, the method further includes: performing cleaning processing on the capacitance dielectric layer 320.

The capacitance dielectric layer 320 is formed in an etching manner, polymers and dust particles are easily accumulated on the surface of the capacitance dielectric layer 320, and the surface is further easily adhered to movable metal ions (for example, potassium ions and calcium ions). The cleaning processing is used to remove the polymers, dust particles, and movable metal ions. This not only improves the surface quality of the capacitance dielectric layer 320, and improves the water resistance of the surface of the capacitance dielectric layer 320, to provide a good interface state for subsequently forming a second electrode layer, but also can remove the movable metal ions, to reduce the probability of forming a conductive channel in the capacitance dielectric layer 320, and improve the reliability of the capacitance dielectric layer 320, thereby reducing the probability of forming a cavity in the capacitance dielectric layer 320, the second electrode layer, and the first electrode layer 310. Correspondingly, a leakage current problem can be improved, to further help improve the performance of a semiconductor device including the capacitor structure.

In some implementations, a solution used in the cleaning processing is an ST250 solution, an NE111 solution, an NE320 solution, or an EKC520 solution. The ST250 solution is a cleaning solution produced by Entegris, the NE111 solution and the NE320 solution are cleaning solutions produced by Air Products, and the EKC520 solution is a cleaning solution produced by DuPont. The foregoing solutions are less corrosive for a film layer (for example, a metal layer and a dielectric layer) in a BEOL, but can effectively remove polymers, impurities, and dusts, thereby guaranteeing the cleaning effect and reducing process risks and side effects.

It should be noted that, a process time of the cleaning processing should not be excessively short or excessively long. If the process time is excessively short, a bad cleaning effect is easily caused. If the process time is excessively long, the manufacturing efficiency is reduced, and the capacitance dielectric layer 320 and other film layers are in the cleaning environment for a long time, process risks are easily increased. Therefore, in some implementations, the process time of the cleaning processing is 10 s to 300 s.

Figure 5:
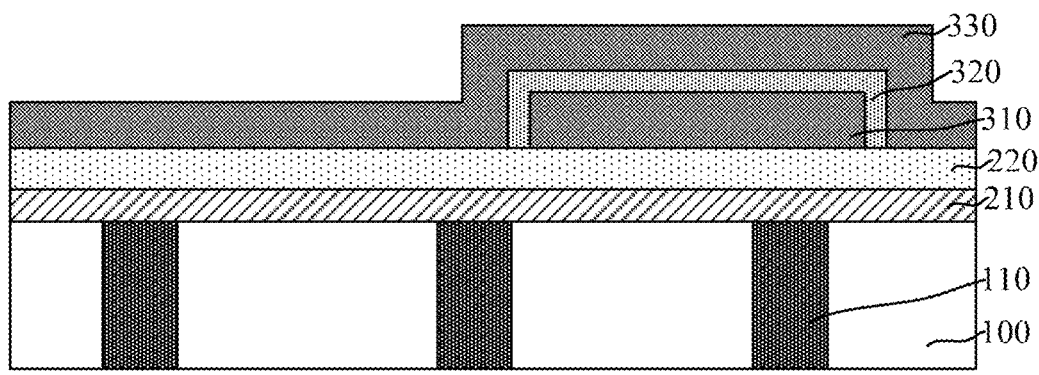

Referring to FIG. 5, a second electrode layer 330 conformally covering the capacitance dielectric layer 320 is formed. The second electrode layer 330 is used as a top plate of the MIM capacitor.

Therefore, the material of the second electrode layer 330 is a metal material. Specifically, the material of the second electrode layer 330 is an inert nitride metal. In some implementations, the material of the second electrode layer 330 is TiN. In other implementations, the material of the second electrode layer may also be TaN or WN.

For specific descriptions of the second electrode layer 330, reference may be made to corresponding descriptions in the foregoing first electrode layer 310. Details are not described herein again.

In some implementations, the second electrode layer 330 conformally covers the capacitance dielectric layer 320 and the base 100, thereby providing a process foundation for subsequently electrically connecting the second electrode layer 330 to an external circuit. Specifically, the second electrode layer 330 conformally covers the capacitance dielectric layer 320 and the first interlayer dielectric layer 220.

In some implementations, the second electrode layer 330 is formed by using a physical vapor deposition process. In other implementations, the second electrode layer may also be formed by using an atomic layer deposition process.

As can be known from the foregoing analysis, the capacitance dielectric layer 320 covers the top and the sidewall of the first electrode layer 310, and the second electrode layer 330 is made to conformally cover the capacitance dielectric layer 320, to form five parallel capacitances, thereby improving the capacitance density of the MIM capacitor.

Figure 6:
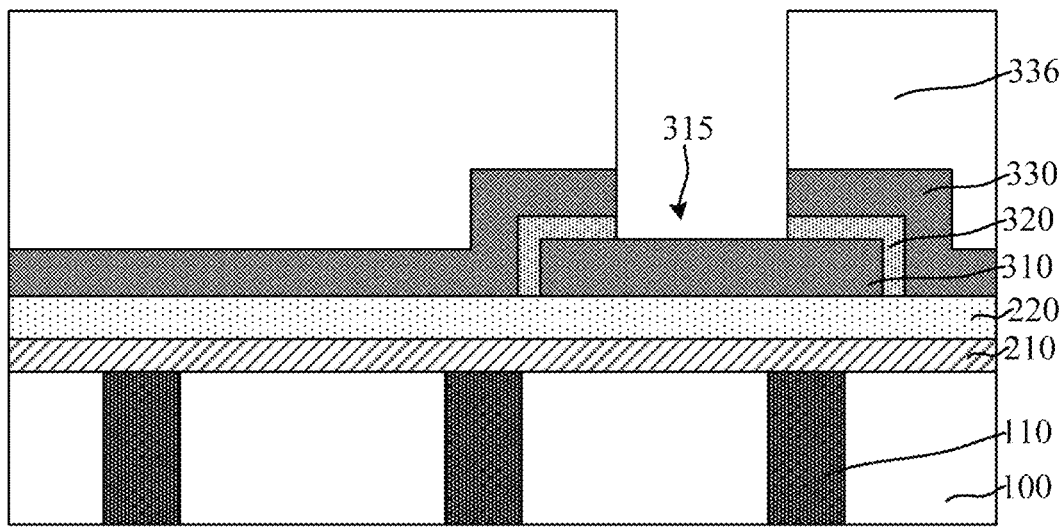
Figure 7:
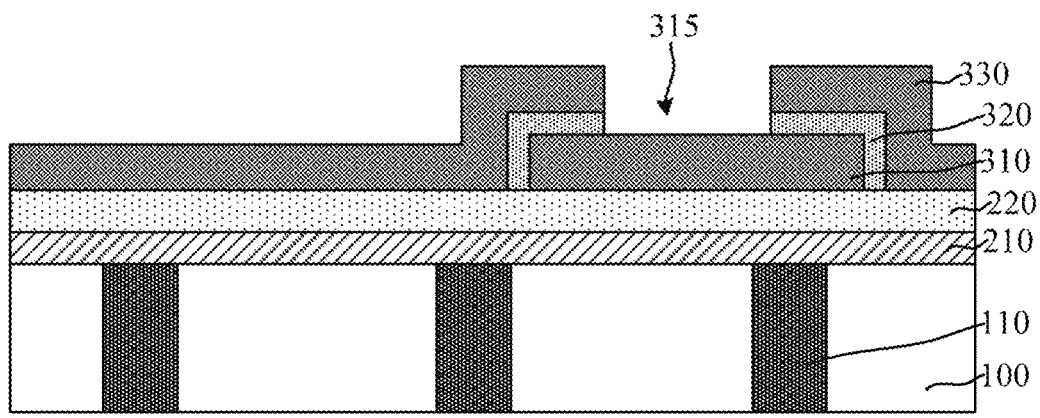

Referring to FIG. 6 to FIG. 7, after forming the second electrode layer 330, the method further includes: forming an opening 315 running through the second electrode layer 330 and the capacitance dielectric layer 320, where the opening 315 exposes the top of the first electrode layer 310.

The opening 315 exposes the top of the first electrode layer 310, thereby providing a process foundation for subsequently electrically connecting the first electrode layer 310 to an external circuit.

Specifically, the step of forming the opening 315 includes: forming a third photoresist layer 336 covering the second electrode layer 330, where a graphic opening (not marked) is formed in the third photoresist layer 336, the graphic opening exposes the second electrode layer 330 on an upper part of the region of the top of the first electrode layer 310; and sequentially etching the second electrode layer 330 and capacitance dielectric layer 320 along the graphic opening by using the third photoresist layer 336 as a mask, to expose the top of the first electrode layer 310, and forming the opening 315 in the second electrode layer 330 and the capacitance dielectric layer 320.

In some implementations, to improve the shape quality of the sidewall of the opening 315, the second electrode layer 330 and the capacitance dielectric layer 320 are sequentially etched by using an anisotropic dry etching process, for example, a plasma dry etching process is used to perform the etching step. In other implementations, an etching process combining dry etching and wet etching may also be used to perform etching.

As shown in FIG. 7, in some implementations, after the opening 315 is formed, the third photoresist layer 336 (as shown in FIG. 6) is removed using ashing or wet removing of photoresist.

It should be noted that, as can be known from the foregoing content, the MIM capacitor is formed above the base 100 of the capacitance region (not marked). Therefore, in an actual process, the graphic opening in the third photoresist layer 336 further exposes the second electrode layer 330 of other regions than the capacitance region. After the third photoresist layer 336 is used as a mask to perform etching, the second electrode layer 330 of other regions is correspondingly removed, thereby providing a process foundation for subsequently forming the metal interconnection structure.

Figure 8:
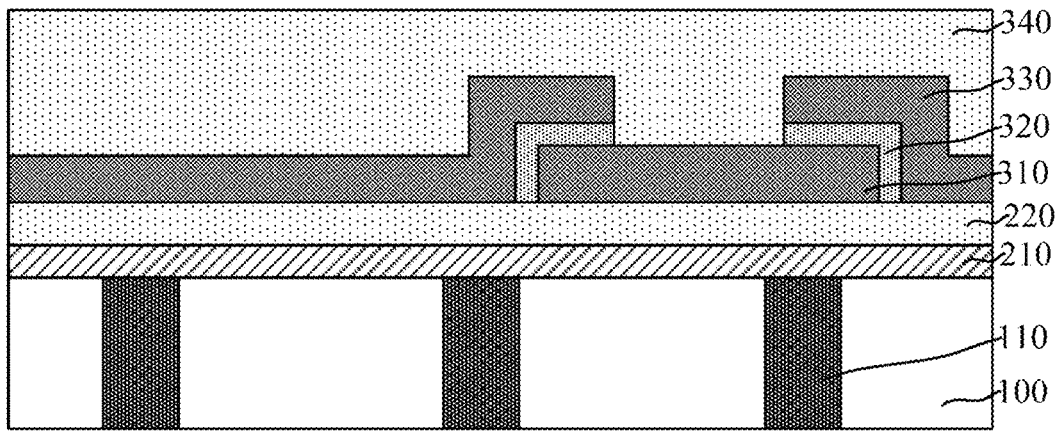

Referring to FIG. 8, after the opening 315 (as shown in FIG. 7) is formed, a second interlayer dielectric layer 340 is formed on the second electrode layer 330, and the second interlayer dielectric layer 340 is further filled in the opening 315.

The second interlayer dielectric layer 340 is used to provide a process platform for subsequently forming a conductive pole electrically connected to the first electrode layer 310 and the second electrode layer 330.

In some implementations, because the MIM capacitor is formed on a metal interconnection structure in a BEOL, the second interlayer dielectric layer 340 is further used as a flat layer, to improve the flatness of the top surface of the IMD layer subsequently.

To improve the process compatibility, the material of the second interlayer dielectric layer 340 is the same as the material of the IMD layer. In some implementations, the material of the second interlayer dielectric layer 340 is SiO.

It should be noted that, compared with the material of the IMD layer, the second interlayer dielectric layer 340 has higher density, so that the second interlayer dielectric layer 340 has higher flatness of the top surface after a flattening process.

Specifically, a deposition process and a flattening process are sequentially performed, to form the second interlayer dielectric layer 340.

In some implementations, the deposition process is a chemical vapor deposition process.

It should be noted that, in other implementations, the second interlayer dielectric layer is the IMD layer, and is further used to provide a process platform for subsequently forming the metal interconnection structure.

Figure 9:
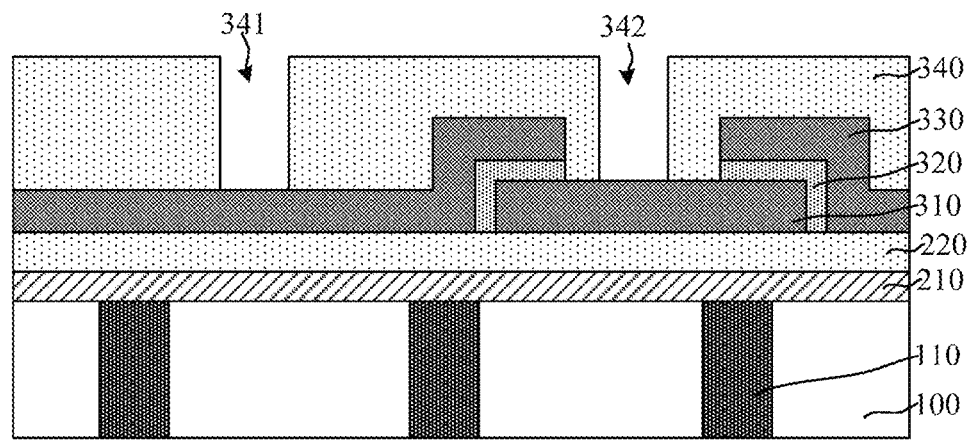

Referring to FIG. 9, a first through hole 341 exposing a top of the second electrode layer 330 is formed in the second interlayer dielectric layer 340, a second through hole 342 exposing the top of the first electrode layer 310 is formed in the second interlayer dielectric layer 340 at the position of the opening 315 (as shown in FIG. 7), and the second interlayer dielectric layer 340 exposed by a sidewall of the second through hole 342 covers the capacitance dielectric layer 320 and the second electrode layer 330.

The first through hole 341 is used to provide a space position for subsequently forming a first conductive pole electrically connected to the second electrode layer 330, and the second through hole 342 is used to provide a space position for subsequently forming a second conductive pole electrically connected to the first electrode layer 310.

In some implementations, the second interlayer dielectric layer 340 is etched in a mask manner, to form the first through hole 341 and the second through hole 342.

Specifically, in a dual damascene process of forming the metal interconnection structure, the first through hole 341 and the second through hole 342 are formed.

In some implementations, the second interlayer dielectric layer 340 is etched using an anisotropic dry etching process. In other implementations, an etching process combining dry etching and wet etching may also be used to perform etching.

It should be noted that, because the second interlayer dielectric layer 340 is filled in the opening 315 (as shown in FIG. 7), the second through hole 342 is formed in the second interlayer dielectric layer 340 at the position of the opening 315. Therefore, in the process of forming the first through hole 341 and the second through hole 342, the etching process is only used to etch the second interlayer dielectric layer 340, and the etching process is relatively simple.

In some implementations, the second through hole 342 is formed in the second interlayer dielectric layer 340 at the position of the opening 315, and the first through hole 341 is formed in the second interlayer dielectric layer 340 on one side of the capacitance dielectric layer 320, so that a distance exists between the second through hole 342 and the first through hole 341, thereby enlarging a process window forming the second through hole 342 and the first through hole 341, and this helps reduce process risks.

In some implementations, the opening 315 has a first opening dimension, the second through hole 342 has a second opening dimension, and the second opening dimension is less than the first opening dimension. Therefore, the second interlayer dielectric layer 340 exposed by the sidewall of the second through hole 342 covers the capacitance dielectric layer 320 and the second electrode layer 330, so that a second conductive pole subsequently formed in the second through hole 342 is electrically isolated from the capacitance dielectric layer 320 and the second electrode layer 330. The first opening dimension is made to be greater than the second opening dimension, so that a process window of a lithographic process and an etching process can also be correspondingly enlarged.

Figure 10:
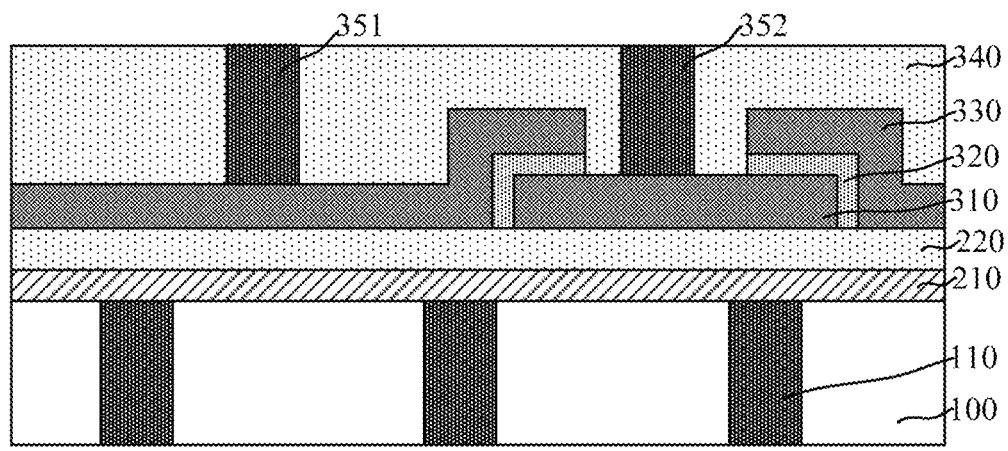

Referring to FIG. 10, a first conductive pole 351 (as shown in FIG. 9) is formed in the first through hole 341, and a second conductive pole 352 (as shown in FIG. 9) is formed in the second through hole 342.

The first conductive pole 351 is used as an external electrode of the second electrode layer 330, and the second conductive pole 352 is used as an external electrode of the first electrode layer 310, thereby electrically connecting the MIM capacitor to an external circuit.

In some implementations, the material of the first conductive pole 351 and the second conductive pole 352 is Cu. In other implementations, other conductive materials, for example, Al and W, may also be used.

In some implementations, after a conductive material is filled in the first through hole 341 and the second through hole 342, flattening processing is performed on the conductive material, to reserve the conductive material in the first through hole 341 as the first conductive pole 351, and reserve the conductive material in the second through hole 342 as the second conductive pole 352.

Specifically, an electroplating process is used to fill the conductive material in the first through hole 341 and the second through hole 342.

Another form of the present disclosure further provides a semiconductor structure. Referring to FIG. 10, FIG. 10 is a schematic structural diagram of one form of a semiconductor structure.

The semiconductor structure includes: a base 100; a first electrode layer 310, located on the base 100; a capacitance dielectric layer 320, located on a top and a sidewall of the first electrode layer 310; and a second electrode layer 330, conformally covering the capacitance dielectric layer 320.

The base 100 is used to provide a process platform for forming an MIM capacitor.

In some implementations, to facilitate representation, only a base 100 of a capacitance region (not marked) is shown, and the MIM capacitor is correspondingly formed on the base 100 of the capacitance region.

In some implementations, the base 100 includes a substrate, and the substrate is a Si substrate. In other implementations, the material of the substrate may also be another material such as Ge, SiGe, SiC, GaAs, or InGa. The substrate may also be a substrate of another type, such as a Si substrate on an insulator or a Ge substrate on an insulator.

Other structures such as a MOS transistor, a resistor, an inductor, a dielectric layer, and the metal interconnection structure may also be formed in the base 100. In some implementations, a front-layer metal interconnection structure 110 is formed in the base 100, and a top of the front-layer metal interconnection structure 110 is aligned with a top of the base 100.

Based on process situations, along a normal direction on the surface of the base 100, one or more stacked metal layers, for example, a first metal layer, and a second metal layer, are formed in the base 100. When the metal layer is multilayer, an IMD layer is formed between two neighboring metal layers, and the two neighboring metal layers are electrically connected using a via interconnection structure located therebetween.

In some implementations, that the front-layer metal interconnection structure 110 is a first metal layer is used as an example for description. The front-layer metal interconnection structure 110 is correspondingly a single damascene structure. In other implementations, when multiple metal layers are formed in the base, the front-layer metal interconnection structure is correspondingly a dual damascene structure.

Therefore, the semiconductor structure further includes: an etching stopping layer 210 located on the base 100.

In a process of forming a metal interconnection structure, the surface of the etching stopping layer 210 is used to define an etching stopping position in an etching process, thereby reducing the probability of causing over etching to the front-layer metal interconnection structure 110.

In some implementations, the material of the etching stopping layer 210 is SiCN. In other implementations, the material of the etching stopping layer may also be SiCO, SiON, or SiN.

The first electrode layer 310 is used as a bottom plate of the MIM capacitor. Therefore, the material of the first electrode layer 310 is a metal material.

Specifically, the material of the first electrode layer 310 is an inert nitride metal, so that the first electrode layer 310 has relatively high stability, to improve a problem of metal ion diffusion.

In some implementations, the material of the first electrode layer 310 is TiN. In other implementations, the material of the first electrode layer may also be TaN or WN.

It should be noted that, the first electrode layer 310, the capacitance dielectric layer 320 located on any sidewall of the first electrode layer 310, and the second electrode layer 330 construct a sidewall capacitance. Therefore, a sidewall area of the first electrode layer 310 may affect a capacitance value of the sidewall capacitance, thereby affecting the capacitance density of the MIM capacitor.

In some implementations, to prevent the first electrode layer 310 from overly occupying the area of the base 100, the thickness of the first electrode layer 310 is reasonably controlled, thereby adjusting the sidewall area of the first electrode layer 310.

As can be seen from a capacitance formula, the capacitance value is proportional to the area of an electrode plate. A smaller thickness of the first electrode layer 310 indicates a smaller sidewall area of the first electrode layer 310, thereby causing a relatively small increase degree of the capacitance density of the MIM capacitor. However, the thickness of the first electrode layer 310 should also not be excessively large. Otherwise, a total capacitance value of the MIM capacitors may be excessively large, thereby triggering a problem that the performance of the semiconductor device is poor. Therefore, in some implementations, the thickness of the first electrode layer 310 is 300 Å to 800 Å.

It should be noted that, the MIM capacitor is formed between neighboring metal layers in a BEOL. Therefore, the first electrode layer 310 is located on a partial region on the base 100.

In some implementations, the etching stopping layer 210 is formed on the base 100, and the first electrode layer 310 is correspondingly located on the etching stopping layer 210.

It should be noted that, the semiconductor structure further includes: a first interlayer dielectric layer 220 located on the etching stopping layer 210, where the first electrode layer 310 is located on the first interlayer dielectric layer 220.

The first interlayer dielectric layer 220 is used as a transition layer between the first electrode material layer 310 and the etching stopping layer 210, to reduce the probability that the first electrode layer 310 has a delamination or crack problem caused by a stress.

The first interlayer dielectric layer 220 is further used to implement isolation between metal interconnection structures in a BEOL.

Therefore, in some implementations, the material of the first interlayer dielectric layer 220 is SiO.

In other implementations, the material of the first interlayer dielectric layer may also be a low-k dielectric material or an ultra-low-k dielectric material, for example, SiOH, SiOCH, FSG, BSG, PSG, BPSG, HSQ, or MSQ.

The capacitance dielectric layer 320 is used as an insulating layer in the MIM capacitor.

In some implementations, the material of the capacitance dielectric layer 320 is a high-k dielectric material. The high-k dielectric material is used to help improve a capacitance value of the MIM capacitor.

Specifically, the capacitance dielectric layer 320 is a high-k dielectric layer of a lamination structure, that is, the capacitance dielectric layer 320 is a high-k composite dielectric layer. After the forming thickness of the high-k dielectric layer reaches a value, the forming quality easily become poor. Therefore, the high-k composite dielectric layer is used to make the thickness of the capacitance dielectric layer 320 meet process requirements, and have relatively good forming quality.

In some implementations, the high-k dielectric material may be any types of $HfO_2$, HfSiO, $TiO_2$, HfZrO, HfSiON, HfTaO, HfTiO, $Ta_2O_5$, $ZrO_2$, $ZrSiO_2$, $Al_2O_3$, $SrTiO_3$, and BaSrTiO.

In other implementations, based on process requirements, the material of the capacitance dielectric layer may also be one or more of SiO, SiON, and SiN.

The capacitance dielectric layer in the MIM capacitor is generally only located on the top of the first electrode layer. In some implementations, the capacitance dielectric layer 320 not only covers the top of the first electrode layer 310, but also covers the sidewall of the first electrode layer 310, and the second electrode layer 330 correspondingly covers the capacitance dielectric layer 320 on the top and the sidewall of the first electrode layer 310. Compared with a solution in which the capacitance dielectric layer only covers the top of the first electrode layer, in some implementations, an effective area between a top plate and a bottom plate of the MIM capacitor is increased, so that the second electrode layer 330, the first electrode layer 310, and the capacitance dielectric layer 320 located on the top of the first electrode layer 310 construct one capacitance, and the second electrode layer 330, the first electrode layer 310, and the capacitance dielectric layer 320 located on the sidewall of the first electrode layer 310 construct other four capacitances (that is, four sidewall capacitances). The capacitor structure includes five parallel capacitances, and a total capacitance value of the parallel capacitances is equal to the sum of capacitance values. Therefore, in a situation in which other conditions are the same, for example, the areas of the bases 100 are equal, the capacitance density of the capacitor structure is increased, so that the performance of the MIM capacitor can meet application requirements.

As can be known from the capacitance formula, a capacitance value of a single capacitor is inversely proportional to the thickness of the capacitance dielectric layer 320. A larger thickness of the capacitance dielectric layer 320 indicates a smaller capacitance value of the single capacitor, thereby causing a relatively small total capacitance value of the parallel capacitances. However, the thickness of the capacitance dielectric layer 320 should also not be excessively small. If the thickness of the capacitance dielectric layer 320 is excessively small, the thickness uniformity and the film layer quality of the capacitance dielectric layer 320, and the coverage capability of the capacitance dielectric layer 320 on the first electrode layer 310 are easily reduced. In addition, if the thickness is excessively small, the linearity between the capacitance value and the thickness of the capacitance dielectric layer 320 may be reduced, and a leakage current problem is easily triggered. Therefore, in some implementations, the thickness of the capacitance dielectric layer 320 is 20 Å to 130 Å.

It should be noted that, in an actual process, the thickness of the capacitance dielectric layer 320 and the thickness of the first electrode layer 310 should be controlled within a reasonable range, and reasonably matched, thereby improving the capacitance density, so that the total capacitance value of the MIM capacitors meets application requirements, and reducing the probability of generating side effects.

The second electrode layer 330 is used as a top plate of the MIM capacitor. Therefore, the material of the second electrode layer 330 is a metal material.

Specifically, the material of the second electrode layer 330 is an inert nitride metal. In some implementations, the material of the second electrode layer 330 is TiN. In other implementations, the material of the second electrode layer may also be TaN or WN.

For specific descriptions of the second electrode layer 330, reference may be made to corresponding descriptions in the foregoing first electrode layer 310. Details are not described herein again.

In some implementations, the second electrode layer 330 conformally covers the capacitance dielectric layer 320 and the base 100, thereby providing a process foundation for subsequently electrically connecting the second electrode layer 330 to an external circuit. Specifically, the second electrode layer 330 conformally covers the capacitance dielectric layer 320 and the first interlayer dielectric layer 220.

As can be known from the foregoing analysis, the capacitance dielectric layer 320 covers the top and the sidewall of the first electrode layer 310, and the second electrode layer 330 is made to conformally cover the capacitance dielectric layer 320, to form five parallel capacitances, thereby improving the capacitance density of the MIM capacitor.

In some implementations, the semiconductor structure further includes: an opening 315 (as shown in FIG. 7) running through the second electrode layer 330 and the capacitance dielectric layer 320, where the opening 315 exposes the top of the first electrode layer 310; and a second interlayer dielectric layer 340 located on the second electrode layer 330, where the second interlayer dielectric layer 340 is further filled in the opening 315.

The opening 315 exposes the top of the first electrode layer 310, thereby providing a process foundation for electrically connecting the first electrode layer 310 to an external circuit.

The MIM capacitor is formed on a metal interconnection structure in a BEOL, and the second interlayer dielectric layer 340 is further used as a flat layer, to improve the flatness of the top surface of the IMD layer.

To improve the process compatibility, the material of the second interlayer dielectric layer 340 is the same as the material of the IMD layer. In this embodiment, the material of the second interlayer dielectric layer 340 is SiO.

It should be noted that, the process of forming the second interlayer dielectric layer 340 generally includes a flattening process. Therefore, compared with the material of the IMD layer, the second interlayer dielectric layer 340 has higher density, so that the second interlayer dielectric layer 340 has higher flatness of the top surface after the flattening process.

It should be noted that, in other implementations, the second interlayer dielectric layer is the IMD layer, and is further used to provide a process platform for forming the metal interconnection structure.

In some implementations, the semiconductor structure further includes: a first conductive pole 351 running through the second interlayer dielectric layer 340, where the first conductive pole 351 is electrically connected to the top of the second electrode layer 330; and a second conductive pole 352 running through the second interlayer dielectric layer 340 at the position of the opening 315, where the second conductive pole 352 is electrically connected to the top of the first electrode layer 310, and the second conductive pole 352 is isolated from the capacitance dielectric layer 320 and second electrode layer 330 by using the second interlayer dielectric layer 340.

The first conductive pole 351 is used as an external electrode of the second electrode layer 330, and the second conductive pole 352 is used as an external electrode of the first electrode layer 310, thereby electrically connecting the MIM capacitor to an external circuit.

In some implementations, the material of the first conductive pole 351 and the second conductive pole 352 is Cu. In other implementations, other conductive materials, for example, Al and W, may also be used.

Specifically, the first conductive pole 351, the second conductive pole 352, and a via interconnection structure in the metal interconnection structure located above the base 100 is an integral structure.

In some implementations, the second conductive pole 352 is isolated from the capacitance dielectric layer 320 and the second electrode layer 330 by using the second interlayer dielectric layer 340, so that the first electrode layer 310 and second electrode layer 330 are electrically isolated, to ensure the normal performance of the MIM capacitor.

In some implementations, the first conductive pole 351 is located in the second interlayer dielectric layer 340 on one side of the capacitance dielectric layer 320, so that a distance exists between the first conductive pole 351 and the second conductive pole 352, thereby enlarging a process window forming the first conductive pole 351 and the second conductive pole 352, and this help reduce process risks.

In some implementations, the semiconductor structure may be formed by using the forming method in the foregoing embodiment, or may be formed by using another forming method. For specific descriptions of the semiconductor structure of this embodiment, reference may be made to corresponding descriptions in the foregoing embodiment. Details are not described herein again in this embodiment.

Although the present disclosure is disclosed as above, the present disclosure is not limited thereto. Various variations and modifications may be made by any person skilled in the art without departing from the spirit and scope of the present disclosure. Therefore, the protection scope of the present disclosure shall be subject to the scope limited by the claims.

What is claimed is:

1. A method for forming a semiconductor structure, comprising:
    providing a base;
    forming a first electrode layer on the base;
    forming a capacitance dielectric layer on a top and a sidewall of the first electrode layer;
    after forming the capacitance dielectric layer, performing cleaning processing on the capacitance dielectric layer; and
    after performing the cleaning processing, forming a second electrode layer conformally covering the capacitance dielectric layer.

2. The method of claim 1, wherein the step of forming the capacitance dielectric layer comprises:
    forming a capacitance dielectric film, wherein the capacitance dielectric film conformally covers the top and the sidewall of the first electrode layer, and the base exposed by the first electrode layer;
    forming a graphic layer on the capacitance dielectric film, wherein the graphic layer covers the capacitance dielectric film located on the top and the sidewall of the first electrode layer;
    removing, using the graphic layer as a mask, the capacitance dielectric film exposed by the graphic layer, and reserving the capacitance dielectric film on the top and the sidewall of the first electrode layer as the capacitance dielectric layer; and
    removing the graphic layer.

3. The method of claim 2, wherein the capacitance dielectric film is formed using an atomic layer deposition process or a plasma chemical vapor deposition process.

4. The method of claim 2, wherein the capacitance dielectric film exposed by the graphic layer is removed using an anisotropic dry etching process.

5. The method of claim 1, wherein a solution used in the cleaning processing is an ST250 solution, an NE111 solution, an NE320 solution, or an EKC520 solution, and a process time of the cleaning processing is 10s to 300s.

6. The method of claim 1, wherein in the step of forming the first electrode layer, the thickness of the first electrode layer is 300 Å to 800 Å.

7. The method of claim 1, wherein in the step of forming the capacitance dielectric layer, the thickness of the capacitance dielectric layer is 20 Å to 130 Å.

8. The method of claim 1, wherein the capacitance dielectric layer is a high-k dielectric layer formed by means of stacking.

9. The method of claim 1, wherein the second electrode layer is formed using a physical vapor deposition process.

10. The method of claim 1, wherein a front-layer metal interconnection structure is formed in the base, and a top of the front-layer metal interconnection structure is aligned with a top of the base;
    wherein the method further comprises: before forming the first electrode layer, forming an etching stopping layer on the base; and forming a first interlayer dielectric layer on the etching stopping layer; and
    wherein the step of forming the first electrode layer comprises: forming the first electrode layer on the first interlayer dielectric layer.

11. The method of claim 1, wherein the method further comprises, after forming the second electrode layer:
    forming an opening running through the second electrode layer and the capacitance dielectric layer, wherein the opening exposes the top of the first electrode layer;
    forming a second interlayer dielectric layer on the second electrode layer, wherein the second interlayer dielectric layer is further filled in the opening;
    forming a first through hole exposing a top of the second electrode layer in the second interlayer dielectric layer, and forming a second through hole exposing the top of the first electrode layer in the second interlayer dielectric layer at the position of the opening, wherein the second interlayer dielectric layer exposed by a sidewall of the second through hole covers the capacitance dielectric layer and the second electrode layer; and
    forming a first conductive pole in the first through hole, and forming a second conductive pole in the second through hole.

12. The method of claim 1, wherein the second electrode layer conformally covers the capacitance dielectric layer and the base is formed.

13. A semiconductor structure, comprising:
    a base;
    a first electrode layer, located on the base;
    a capacitance dielectric layer, located on a top and a sidewall of the first electrode layer;
    a second electrode layer, conformally covering the capacitance dielectric layer;
    an opening running through the second electrode layer and the capacitance dielectric layer, wherein the opening exposes the top of the first electrode layer; and
    a second interlayer dielectric layer located on the second electrode layer, wherein the second interlayer dielectric layer is further filled in the opening;
    a first conductive pole running through the second interlayer dielectric layer, wherein the first conductive pole is electrically connected a top of the second electrode layer; and
    a second conductive pole running through the second interlayer dielectric layer at the position of the opening, wherein the second conductive pole is electrically connected to the top of the first electrode layer, and the second conductive pole is isolated from the capacitance dielectric layer and the second electrode layer by using the second interlayer dielectric layer.

14. The semiconductor structure according to claim 13, wherein the thickness of the first electrode layer is 300 Å to 800 Å.

15. The semiconductor structure according to claim 13, wherein the thickness of the capacitance dielectric layer is 20 Å to 130 Å.

16. The semiconductor structure according to claim 13, wherein the capacitance dielectric layer is a high-k dielectric layer of a lamination structure.

17. The semiconductor structure according to claim 13, wherein:
    a front-layer metal interconnection structure is formed in the base, and a top of the front-layer metal interconnection structure is aligned with a top of the base;
    the semiconductor structure further comprises: an etching stopping layer located on the base; and a first interlayer dielectric layer located on the etching stopping layer; and
    the first electrode layer is located on the first interlayer dielectric layer.

18. The semiconductor structure according to claim 13, wherein the second electrode layer conformally covers the capacitance dielectric layer and the base.

* * * * *